United States Patent [19]

Besson et al.

[11] Patent Number: 5,006,750
[45] Date of Patent: Apr. 9, 1991

[54] DISMOUNTABLE DEVICE FOR SUPPORTING A PIEZOELECTRIC RESONATOR INSIDE A CASING

[75] Inventors: Raymond Besson, Besancon; Richard Delaite, Belfort; Georges Renard, St Vit; Jean-Pascal Valentin, Pouilley Les Vignes; Jean-Louis Vaterkowski, Rioz, all of France

[73] Assignee: Ecole Nationale Superieure de Mecanique et des Microtechniques, Bescanon Cedex, France

[21] Appl. No.: 423,254

[22] Filed: Oct. 18, 1989

[30] Foreign Application Priority Data

Oct. 28, 1988 [FR] France ................................. 88 14197

[51] Int. Cl.⁵ ............................................. H01L 41/08
[52] U.S. Cl. ...................................... 310/348; 310/356
[58] Field of Search .......................... 310/348, 351–356

[56] References Cited

U.S. PATENT DOCUMENTS 2,315,392   3/1943   Bokovoy ........................... 310/356 X
4,464,598   8/1984   Besson et al. ..................... 310/348 X
4,626,732  12/1986   Debaisieux et al. ............... 310/348
4,686,324   8/1987   Debaisieux et al. ............ 310/348 X
4,705,982  11/1987   Besson et al. ...................... 310/356

FOREIGN PATENT DOCUMENTS 2583584   6/1985   France .

Primary Examiner—Mark O. Budd
Attorney, Agent, or Firm—Staas & Halsey

[57] ABSTRACT

A supporting device including four independent and identical U-shaped coupling flanges each cooperating with a pair of springs. Each spring is formed of a circular cross section metal wire made of high elastic limit alloy. The set of coupling flanges and springs is symmetrical with respect to two mutually perpendicular axial planes of resonator and with respect to a central plane of the resonator. A cylindrical element is mounted inside the casing in a region of a lateral wall of the housing and has a circular groove on its inner face and located on a center plane parallel to the top and bottom walls of the housing. For each pair of springs cooperating with a coupling flange, one of the springs engages by a first portion into an upper slot formed in a planar rear face of the coupling flange and by a second portion in the circular groove. The inner faces of the coupling flanges rest directly on the edge of the top and bottom faces of the resonator.

23 Claims, 3 Drawing Sheets

DISMOUNTABLE DEVICE FOR SUPPORTING A PIEZOELECTRIC RESONATOR INSIDE A CASING

BACKGROUND OF THE INVENTION

1. Field of the Invention

The present invention relates to mechanical structures for supporting piezoelectric resonators, and in particular to a dismountable device for supporting a piezoelectric resonator inside a casing, said device comprising four independent and identical U-shaped coupling flanges made of a material whose expansion coefficient in an axial direction with respect to said resonator is substantially identical to that of the material constituting said resonator, each said coupling flange cooperating with a pair of springs, each spring being formed of circular cross-section metal wire made of a high yield strength alloy, the thus constituted set of coupling flanges and springs being symmetrical with respect to two mutually perpendicular axial planes of said resonator and with respect to a center plane of said resonator.

2. Prior Art

Various examples of piezoelectric resonators are already known.

According to one conventional example, a crystal resonator is constituted by a planoconvex or biconvex quartz plate, of circular contour, on the front faces of which plate are directly deposited metallic electrodes, known as adhering electrodes.

According to another example, the quartz plate with adhering electrodes is limited on the outside by a quartz ring used for supporting the crystal resonator.

According to yet another example U.S. Pat. No. 4,705,982, the crystal resonator is connected to a quartz ring via bridges cut through the mass. The electrodes may be adhering or non-adhering. In the latter case, the electrodes are deposited over quartz plates having the same contour and shape as the crystal, and only the rings of the plates supporting the electrodes are in contact with the ring of the vibrating part of the crystal.

Irrespective of the type of resonator used, it is generally necessary to incorporate the resonator within a protective casing which, if sealed, further allows it to enclose a high or low vacuum which improves the resonator's operating conditions, and hence its performance characteristics.

The casing and crystal resonator do not, however, have the same mechanical and thermal characteristics, making it therefore necessary to provide a special mechanical structure in view of limiting the effect of external perturbations and introducing a minimum amount of stress at the center of the crystal.

It has already been proposed in document U.S. Pat. No. 4,705,982 to provide a device for supporting a piezoelectric resonator inside a casing that is suitable for different types of piezoelectric resonators and designed to minimize the resonator's relative frequency variations due to accelerometric, thermal or pressure induced perturbations, so as to give maximum stability and lowest possible aging effects to the resonator.

According to the above supporting device, there are provided first and second identical half-shells for positioning the resonator, the said half-shells being in a material having the same nature and design as the material constituting the resonator, and each one being cross-shaped and comprising four branches of which the free ends define angle pieces with a horizontal bearing surface of small dimensions, which surface is slightly raised with respect to the central part of the corresponding half-shell as well as one vertical branch holding the edge of the resonator and four identical independent securing flanges to secure the two half shells in position, said flanges having the shape of a down-turned U, each flange comprising, at the end of each branch of the U, two stop elements bearing against two superposed branches of the two half-shells of the bearing faces of those branches facing said horizontal bearing surfaces and cooperating with at least four pairs of springs for suspending the four securing flanges with respect to the casing.

In such a known resonator supporting device, the springs for suspending the coupling flanges holding the cross shaped half-shells are joined directly to the casing and fixed by one of their ends to the junction between the different walls forming the casing. This prevents a complete uncoupling between the housing—whose main purpose is to maintain the vacuum within its enclosing space, and which can be submitted to shocks or distortions—and the suspension system itself, which must remain as symmetrical as possible. Besides, the manufacture of cross shaped half-shells in a material having the same nature and design as that of the resonator introduces a cost penalty.

SUMMARY OF THE INVENTION

It is an object of the present invention to specifically overcome the aforesaid disadvantages and to provide for supporting a resonator inside a casing, which is simpler and less costly to manufacture in comparison with known devices, and which further provides a more efficient uncoupling between the casing and the elements for suspending the resonator, while simultaneously allowing easy dismantaling and reassembly of the suspension-forming elements.

The above objects are achieved by means of a supporting device of the type defined at the beginning of the description wherein the said device is further comprised of a cylindrical element that is displaceably mounted inside the said casing in a region of a lateral wall thereof, wich element extending throughout the height of an inner space defined by top and bottom walls of said casing and having on the inner face thereof a circular groove located at a center plane parallel to said top and bottom walls of said housing; wherein for each pair of springs cooperating with a common coupling flange, one of said springs engages by a first portion into a top slot formed in a planar rear face of said coupling flange at a top portion thereof and by a second portion in said circular groove; while said other spring is engaged by a first portion in a bottom slot formed in said rear planar face of said coupling flange at a bottom portion thereof, and by a second portion in said circular groove wherein said second portions of said springs engaged in said circular groove are joined together and project rearwardly with respect to said rear face of said coupling flange, and wherein said internal faces of said coupling flange, which are substantially perpendicular to said rear face of said coupling flanges rest directly on the periphery of the top and bottom external faces of said resonator.

Alternatively, said casing can include disks for supporting electrodes of said resonator, in which case said internal faces of said coupling flanges which are substantially perpendicular to said rear face of said coupling flanges rest directly on said supporting disks of said electrodes of said resonator. In the latter alternative, hollow portions may be formed on the walls of the disk supporting said electrodes of said resonator in zones prolonging, radially towards the center of said resonator, said zones where said coupling flanges are in contact with the top and bottom faces of said supporting disks over a distance on the order of 1 to 2 millimeters.

Preferably, said circular groove has an an annular shape with a rectangular cross section.

The cylindrical element is metallic and possesses a shoulder portion at one of its ends to provide a free space between said lateral wall of said casing and a cylindrical element on a major portion of the height thereof.

According to a specific feature of the present invention, said internal faces of said coupling flanges which are substantially perpendicular to said rear face have a regular surface in contact with the top and bottom external faces of said resonator over a zone extending radially along a distance on the order of 1 to 2 mm.

Alternatively, in the case of a resonator equipped with supporting disks for said resonator electrodes, said coupling flanges which are substantially perpendicular to said rear face have a regular surface in contact with said top and bottom external faces of said supporting disks over a zone extending along a distance on the order of 1 to 2 millimeters.

In a more specific embodiment of the present invention, the springs have discontinuities at the level of said first portion engaged in said slot of said rear face of said coupling flange cooperating therewith, said springs being symmetrical with respect to a vertical radical plane situated at the level of said discontinuity and having a configuration such that each half spring divided by said vertical radial symmetry plane is comprised of a first horizontal rectilinear portion intended to be lodged within a slot of said coupling flange, a curved vertical portion located outside said coupling flange in a plane forming a 45° angle with respect to the symmetry plane of said spring, and a second horizontal portion, joined to an end of said curved vertical portion that is remote from said first horizontal portion, and forming a part of said second portion located at the rear of said horizontal rectilinear portion, which itself forms a part of said first portion.

BRIEF DESCRIPTION OF THE DRAWINGS

The present invention will be more readily understood on reading the following description with reference to the accompanying drawings in which.

DESCRIPTION OF THE PREFERRED EMBODIMENTS

Figure 1:
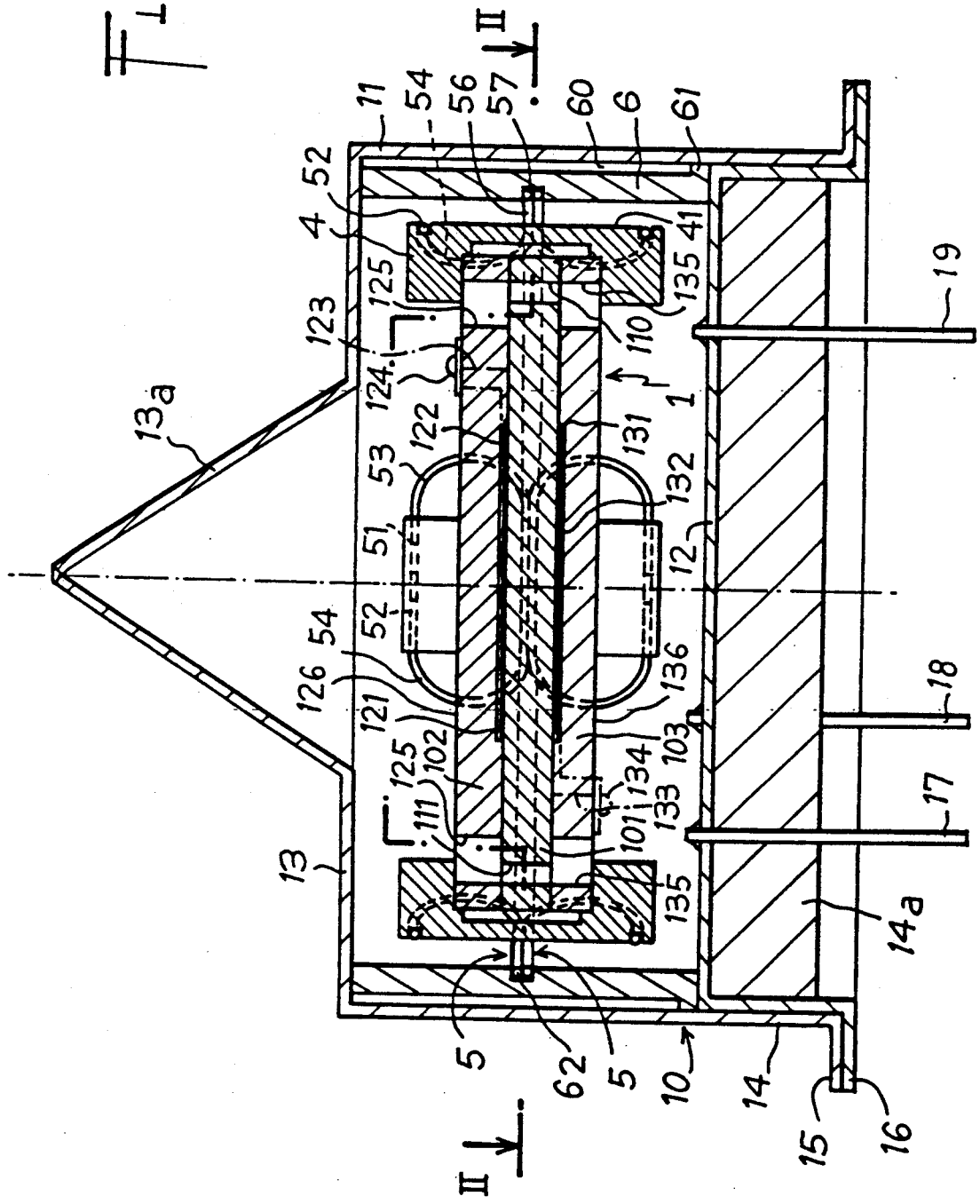
FIG. 1 is an axial cross sectional view taken along a symmetry plane of a casing incorporating a dismountable supporting device of a casing incorporating a dismountable supporting device for a resonator within the casing, according to the invention.
Figure 2:
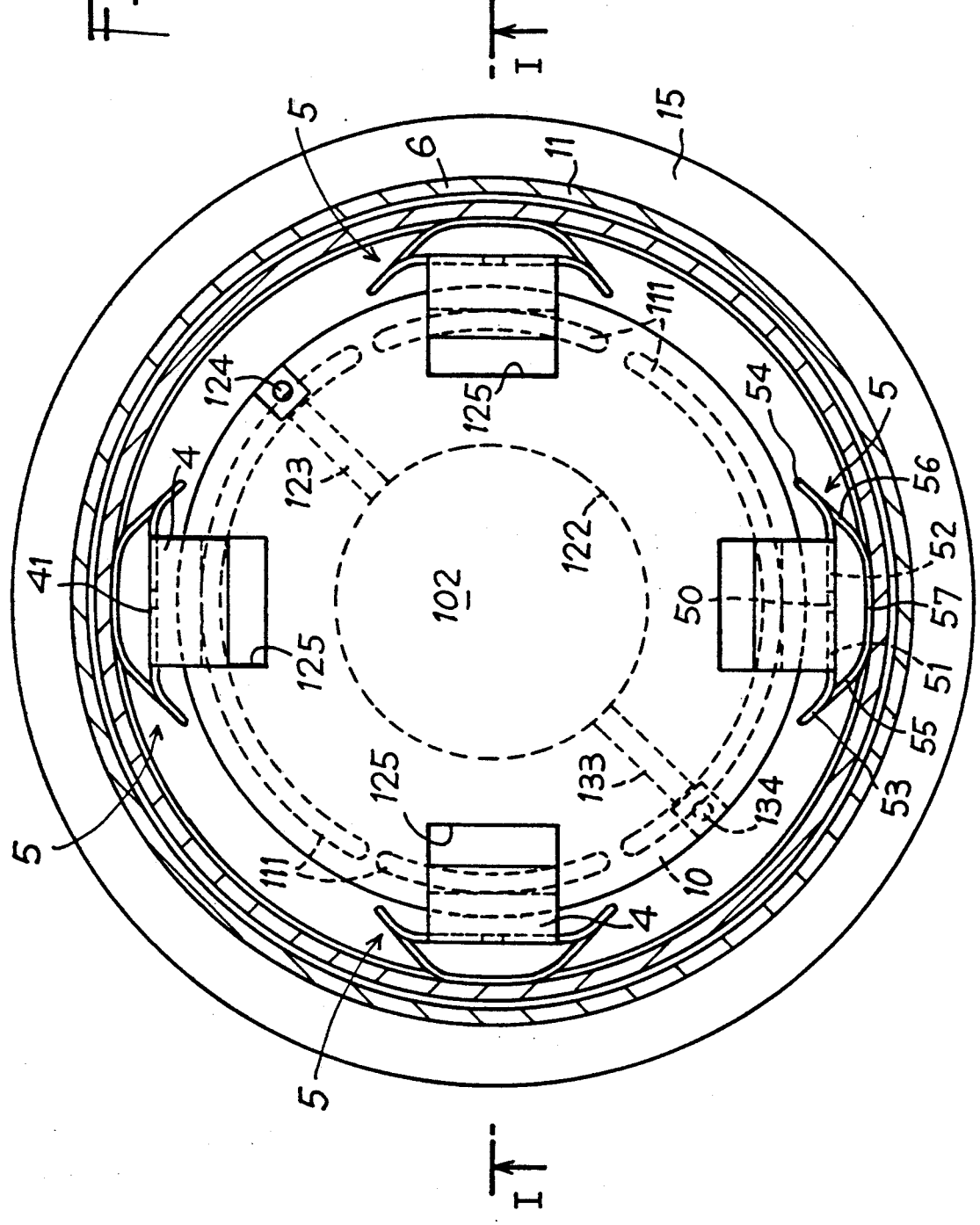
FIG. 2 is a cross-sectional view of the device shown in FIG. 1 taken along the II—II of FIG. 1.

FIGS. 1 and 2 show the set of dismountable elements that form a device for supporting a piezoelectric resonator 1 inside a protective casing 10.

The casing 10 is of classical construction and comprises a hood having a cylindrical lateral wall 11 and a top portion 13 having an extension 13a fitted with a slot to allow a vacumm to be formed inside the casing before the latter is sealed. The hood rests on an annular flange 16 of a base 14 via a cooperating flang 15, the two flanges 15, 16, being intended to be sealed together. The base 14 has a low cylindrical lateral wall that engages inside the hood, and a planar top wall 12 having insulated connection pins 17, 18, 19 threthrough. An insulating material 14a, which can overlay the electronic components associated with the resonator 1 located within the casing, is cast in the free space defined by the cylindrical lateral wall and the top planar wall 12 of the base.

The present description is given with reference to a casing arranged as shown in FIG. 1; the terms "bottom, top, vertical, horizontal" used in the decription are to be interpreted in connection with the description of FIG. 1 and serve to provide a description of the various elements in their relative positions with respect to the position of the FIG. 1. The casing 10 can of course be placed in any other position and the terms "bottom top, vertical, horizontal" must not be considered as limiting in so far as the position of the casing 10, is concerned.

The resonator 1 can be formed by a resonator crystal with adhering electrodes, i.e. it can consist of a plate of piezoelectric material having a given cross section, and on whose main faces are deposited metallic electrodes.

However, the resonator 1 can also comprise a more complex assembly such as that shown in the front view of FIG. 1, with a crystal resonator 101 formed as in the previous case by a plate of piezoelectric material e.g. of the biplanar type, but without the electrodes, and having an external supporting collar 110. The collar is delimited by openings 111 and connected to the central active portion of the crystal by bridging elements and a pair of plates 102, 103 each of which is also fitted with a peripheral supporting portion that bears against the external collar 110 of the crystal iself, so as to form a stack of surfaces fitted against each other at the level of the collar. In this configuration, the central portions 121, 131 of the plates 102, 103, which are located opposite the crystal 101 without contacting the latter, bear exciter electrodes termed non-adhering electrodes 122,132. The compact assembly formed by the crystal 101 and the electrode bearing plates 102,103 can thus be considered as a unit which is equivalent to a resonator with adhering electrodes, except that the elements of the resonator supporting device act on the peripheral portions of the electrode supporting plates, while in the case of a resonator with adhering electrodes the supporting device is in contact with the peripheral portion of the resonator crystal itself.

In FIGS. 1 and 2, reference numerals 123 and 133 designate conductive paths connecting electrodes 122, 132 to a set of respective contacts 124, 134 intended to form an electrical connection with connection pins 17, 18, 19, by means of connecting wires (not shown in the drawings).

The support device according to the invention is designed so as to be entirely symmetrical with respect to two mutually perpendicular axial planes of the resonator 1, as well as with a central radial plane of the resonator 1, and is designed to provide complete uncoupling between the protective casing and the resonator, so that effects due to external perturbations (accelerations, shocks, vibrations, pressure) cannot transmit torsional or flexural moments to the center of the crystal.

The support means are further designed so as to comprise a limited number of parts and to be dismountable.

A first element forming support means for the resonator 1 within the casing consists of a movable cylindrical element 6 made of steel and located between the planar wall 12 of the base of the casing which forms the bottom of a cavity formed inside the casing, and the top wall 13 of the hood of the casing. The cylindrical element 6 is located in the region of the cylindrical lateral wall 11 of the hood for the casing and has on its inner face a circular groove 62 located in a central plane parallel to the top 13 and bottom 12 walls of the casing 10. The groove 62 has an annular shape with a rectangular cross section and is intended to receive connected parts of a pair of springs (which shall be described further in the description) by snap-fitting action. The cylindrical element 6 has a shoulder section 61 at one of its ends to provide a free space 60 between the lateral wall 11 of the casing 10 and the cylindrical element 6 itself on a major portion of the latter's height.

The means for supporting the resonator assembly 1—which, as shown in the Figures, can be comprised of a stack of three disks viz: two electrode bearing disks 102,103 and a central disk 101 forming the resonator itself—comprise four identical and independent coupling flanges 4 located 90° apart and directly cooperating with the top 126 and bottom 136 faces of the resonator.

Each coupling flange form has the shape of a horizontal U and comprises a vertical planar portion 41 on the rear face of which are formed two horizontal slots 46,47 in the region of the lateral branches 42,43 of the coupling flange 4.

The tightening forces exerted by the four coupling flanges 4 are identical, colinear and perpendicular to the top 126 and bottom 136 external faces of the resonator 1, so that no flexing movement is applied to the latter.

In order to prevent variations in compression produced by the coupling flanges 4 as a result of temperature variations, the coupling flanges are made of a material having a low expansion coefficient in the axial direction that is identical or very close to that of the crystal 1. In the case of a quartz crystal, a material known under the trade name of "PHYNOX" can be used.

The effect of differential expansions in a transversal direction—which could arise from the use of materials having different characteristics—is prevented by the use of four independent coupling flanges. Under these conditions, the radial expansions of the crystal can be freely exerted.

The supension function of the assembly formed of the crystal 1 with its electode bearing disks 102,103 and the coupling flanges 4 within the casing 10 is provided by eight identical springs 5 that connect the coupling flanges 4 to the cylindrical element 6. The use of a cylindrical element 6 that is distinct from a casing 10 combined with that of the springs 5, provides an effective isolation of the sensitive part of the resonator 1 from external actions applied to the casing 10. The springs 5 further make it possible to compensate for manufacturing faults between the different assembled elements.

Figure 3:
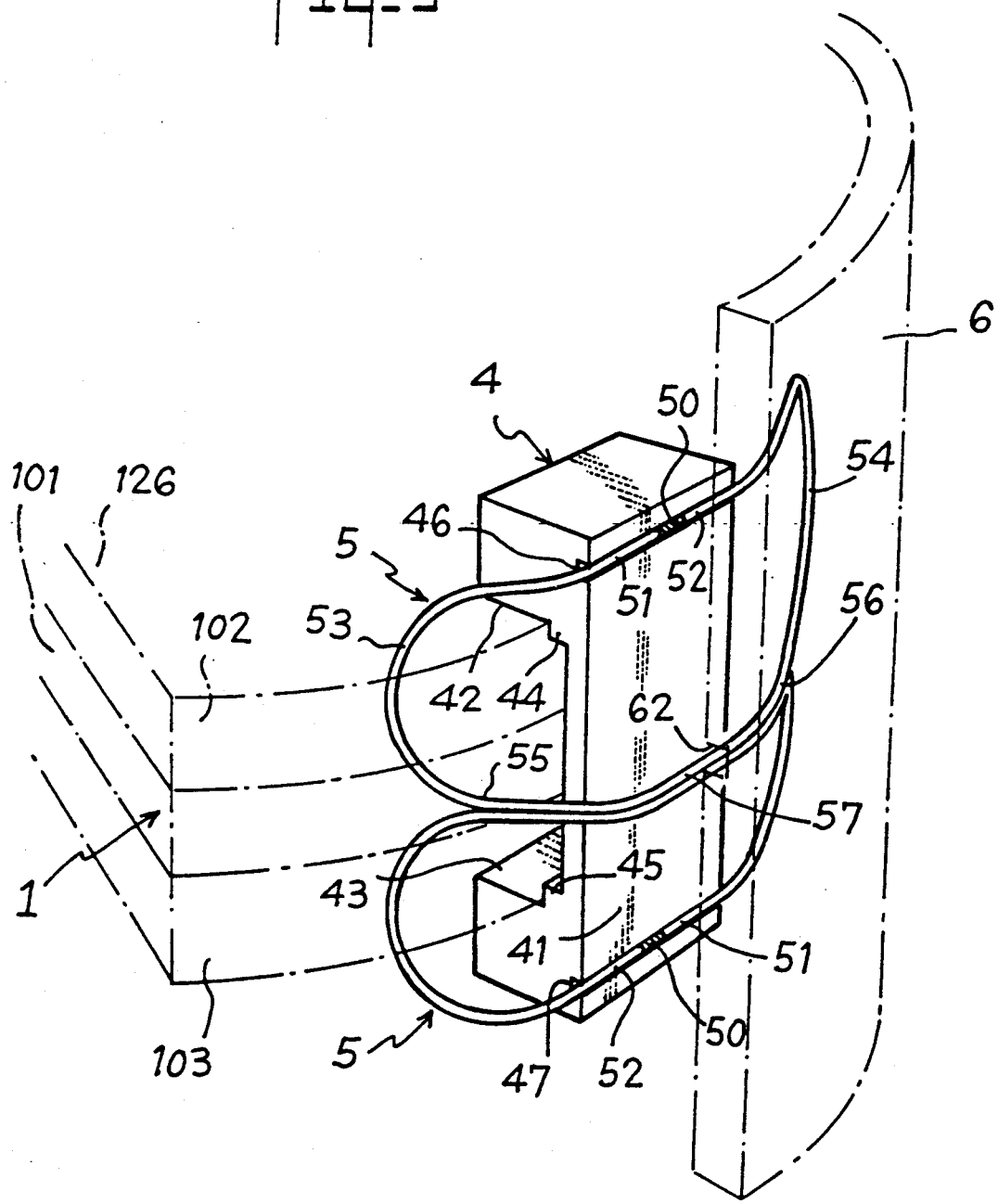
FIG. 3 is a perspective view showing a part of the support elements according to the invention, with a coupling flange and a pair of springs cooperating both with an intermediate cylindrical element that is distinct from the casing and directly with the resonator.

The suspension is designed to be symmetrical so that actions due to external perturbations (accelerations, shocks, vibrations and pressure) cannot transmit tortional or flexural moments to the center of the crystal. Eight shaped springs 5 are thus arranged in pairs 90° apart, each pair of springs acting on the top and bottom portions of a coupling flange 4. The combined effect of the positioning of the springs 5, their specific shape shown in FIGS. 1 to 3, and the use of a wire having a small circular cross section, e.g. 2 tenths of a mm diameter to form springs 5, ensures that the elastic center of the suspension corresponds to the center of gravity of the system's mass and further ensures that the three degrees of freedom are in translation and that each of them is associated to an identical coefficient of rigidity.

Under these conditions, the assembly withstands shocks since the suspension is capable of absorbing and minimizing their effects. As the springs 5 work both in torsion and in flexion they should be made of a high elastic limit alloy (e.g. an alloy of a type known under the name "Phynox"). The springs 5 which form the connection between the coupling flanges and the cylindric element 6 can simply be lodged inside the groove 62 of the cylindrical element 6 so that the assembly comprised of the coupling flange 4 and the springs can be dismantled if needs be, from the cylindrical element 6 and, of course, from the resonator 1 too.

The coupling flanges 4 can be connected to their respective springs 5 by welding, the relative positioning being ensured by the two slots 46, 47 which are cut at the back of each coupling flange 4.

More specifically, for each pair of springs 5 cooperating with a respective coupling flange 4, one of the springs engages by a first portion 51, 52 into a top slot 46 formed in the rear planar surface 41 of the coupling flange at the top portion thereof, and by a second portion 57 in the circular groove 62 of the cylindrical element 6, while the other spring engages by a first portion 51,52 into a bottom slot 47 formed in a rear planar face 41 of the coupling flange 4 at a bottom portion thereof, and by a second portion 57 in the circular groove 62. The second portions 57 of the springs engaged in the circular groove 62 are joined together e.g. by laser welding and project rearwardly with respect to the rear face 41 of the coupling flange over a distance of approximately 1 to 2 millimeters, and preferably on the order of 1.5 millimeters.

The springs 5 have a discontinuity 50 at the level of their first portion 51, 52 that engages in a slot 46, 47 of the rear of the coupling flange with which they cooperate. The springs 5 are symmetrical with respect to a plane located at the level of the discontinuity 50 and which corresponds to the vertical central plane of the coupling flange 4. Each half spring divided by the radially extending vertical symmetry plane comprises a first horizontal rectilinear portion 51; 52 intended to be lodged in a slot 46 or 47 of the receiving coupling flange 4, a curved vertical portion 53;54, approximately corresponding to a fraction of a circle located outside the receiving coupling flange 4 in a plane forming a 45° angle with respect to the symmetry plane of the spring, and a second horizontal portion 57 which is connected to the end 55;56 of the vertical curved part 53; 54 that is remote from the first horizontal part 51; 52 and forms a part of the second portion 57 located at the rear of the said horizontal rectilinear portion 51;52, which itself forms a part of the first portion.

The lateral branches 42, 43 of the coupling flanges 4 that are substantially perpendicular to the rear face 41 have a regular surface contacting the top 126 and bottom 136 external faces of the resonator electrode supporting disks 102, 103 over a zone extending radially along a distance on the order of 1 to 2 millimeters.

The shoulder portions 44,45 are formed on the coupling flanges 4 at the level where the substantially horizontal internal faces 41, 43 join with the internal face of the rear vertical wall.

As can be seen from FIGS. 1 and 2, hollowed portions 125, 135 are formed in the walls of the disks 102, 103 supporting the resonator electrodes in zones extending radially towards the center of the resonator by a distance on the order of 1 to 2 mm the zones where the coupling flanges contact with the top 126 and bottom 136 external faces of the supporting disks 102,103. The above extension is made to prevent the coupling flanges 4—which are in direct contact with the peripheral portions of the disks 102, 103—from transmitting stresses to the central portions of the disks and hence to the crystal 101 forming the resonator itself.

What is claimed is:

1. A device for supporting a piezoelectric resonator inside a casing, said device comprising:

four independent and identical U-shaped coupling flanges made of a material whose expansion coefficient in an axial direction with respect to said resonator is substantially identical to that of the material constituting said resonator, each said coupling flange cooperating with a pair of springs, each spring being formed of circular cross-section metal wire made of a high yield strength alloy, the thus constituted set of coupling flanges and springs being symmetrical with respect to two mutually perpendicular axial planes of said resonator and with respect to a center plane of said resonator, wherein said device is further comprised of a cylindrical element that is displaceably mounted inside said casing in a region of a lateral wall thereof, said element extending throughout the height of an inner space defined by top and bottom walls of said casing and having on the inner face thereof, a circular groove located on a center plane parallel to said top and bottom walls of said casing;

wherein for each pair of springs cooperating with a common coupling flange, one of said springs engages by a first portion into a top slot formed in a planar rear face of said coupling flange at a top portion thereof, and by a second portion in said circular groove while the other of said springs engages by a first portion into a bottom slot formed in a rear planar face of said coupling flange at a bottom portion thereof, and by a second portion inside said circular groove, wherein said second portions of said springs engaged in said circular groove are joined together and project rearwardly with respect to said rear face of said coupling flange; and wherein said internal faces of said coupling flanges which are substantially perpendicular to said rear face of said coupling flanges rest directly on the periphery of the top and bottom external faces of said resonator.

2. A device as claimed in claim 1 wherein said circular groove has an annular shape with a rectangular cross-section.

3. A device as claimed in claim 1 wherein said cylindrical element is metallic and possesses a shoulder portion at one of its ends to provide a free space between said lateral wall of said casing and said cylindrical element on a major portion of the height thereof.

4. A device as claimed in claim 1 wherein said second portions of said springs project rearwardly with respect to said first portions over a distance of between 1 and 2 mm.

5. A device as claimed in claim 1 wherein said coupling flanges and said springs are made of a metal alloy.

6. A device as claimed in claim 1 wherein said internal faces of said coupling flanges substantially perpendicular to said rear face have a regular surface in contact with said top and bottom external faces of said resonator over a zone extending radially along a distance on the order of 1 to 2 mm.

7. A device as claimed in claim 1 wherein shoulders are formed on said coupling flanges at the place where said substantially horizontal internal faces and said rear vertical wall connect.

8. A device as claimed in claim 1 wherein said springs have discontinuities at the level of said first portion engaged in said slot of said rear face of said coupling flange cooperating therewith; wherein said springs are symmetrical with respect to a vertical radial plane situated at the level of said discontinuity; and wherein said springs have a configuration such that each half-spring divided by said vertical radial symmetry plane is comprised of a first horizontal rectilinear portion intended to be lodged within a slot of said coupling flange, a curved vertical portion located outside said coupling flange in a plane forming a 45° angle with respect to the symmetry plane of said spring, and a second horizontal portion joined to an and of said curved vertical portion that is distal with respect to said first horizontal portion and forms part of said second portion that is located at the rear of said horizontal rectilinear portion, which itself forms a part of said first portion.

9. A device as claimed in claim 1 wherein said springs are formed from wires havinga diameter on the order of 20/10 mm.

10. A device for supporting a piezoelectric resonator inside a casing said device comprising:

disks for supporting electrodes of said resonator; four independent and identical U-shaped coupling flanges made of a material whose expansion coefficient in an axial direction with respect to said resonator is substantially identical to that of the material constituting said resonator, each cooperating with a pair of springs, each spring being formed of circular cross-section metal wire made of a high yield strength alloy, the thus-constituted set of coupling flanges and springs being symmetrical with respect to two mutually perpendicular axial planes of said resonator and with respect to a center plane of said resonator, wherein said device is further comprised of a cylindrical element that is displaceably mounted inside said casing in a region of a lateral wall thereof, said element extending throughout the height of an inner space defined by top and bottom walls of said casing and having on the inner face thereof, a circular groove located on a center plane parallel to said top and bottom walls of said casing;

wherein for each pair of springs cooperating with a common coupling flange, one of said springs engages by a first portion into an upper slot formed in a planar rear face of said coupling flange at a top portion thereof, and by a second portion in said circular groove while the other of said springs engages by a first portion into a bottom slot formed in a rear planar face of said coupling flange at a bottom portion thereof, and by a second portion, inside said circular groove;

wherein siad second portions of said springs engaged in said circular groove are joined together and project rearwardly with respect to said rear face of said coupling flange; and wherein said internal faces of said coupling flanges which are substantially perpendicular to said rear face of said coupling flanges rest directly on said supporting disks of said electrodes of said resonator.

11. A device as claimed in claim 10 wherein said circular groove has an annular shape with a rectangular cross-section.

12. A device as claimed in claim 10 wherein said cylindrical element is metallic and possesses a shoulder portion at one end thereof to provide a free space between said lateral wall of said casing and said cylindrical element on a major portion of the height thereof.

13. A device as claimed in claim 10 wherein said second portions of said springs project rearwardly with respect to said first portions over a distance of between 1 and 2 mm.

14. A device as claimed in claim 10 wherein said coupling flanges and said springs are made of a metal alloy.

15. A device as claimed in claim 10 wherein said internal faces of said coupling flanges that are substantially perpendicular to said rear face have a regular surface in contact with said top and bottom external faces of said disks over a zone extending radially over a distance on the order of 1 to 2 mm.

16. A device as claimed in claim 10 wherein shoulders are formed on said coupling flanges at the level where said substantially horizontal internal faces and said inner face of said rear vertical wall connect.

17. A device as claimed in claim 10 wherein hollow portions are formed on the walls of said disk supporting said electrodes of said resonator in zones that extend over a distance on the order of 1 to 2 millimeters radially towards the center of said resonator, those zones where said coupling flanges are in contact with the top and bottom faces of said supporting disks.

18. A device as claimed in claim 10 wherein said springs have discontinuities at the level of said first portion engaged in said slot of said rear face of said coupling flange cooperating therewith, wherein said springs are symmetrical with respect to a vertical radial plane situated at the level of said discontinuity and wherein said springs have a configuration such that each half-spring divided by said vertical radial symmetry plane is comprised of a first horizontal rectilinear portion intended to be lodged within a slot of said coupling flange, a curved vertical portion located outside said coupling flange in a plane forming a 45° angle with respect to the symmetry plane of said springs, and a second horizontal portion joined to an end of said curved vertical portion that is distal with respect to said first horizontal portion and forms a part of said second portion that is located at the rear of said horizontal rectilinear portion, which itself forms a part of said first portion.

19. A device as claimed in claim 10 wherein said springs (5) are formed from wires having a diameter on the order of 2/10 mm.

20. A device as claimed in claim 1 wherein said second portions of said springs project rearwardly with respect to said first portions over a distance of about 1.5 mm.

21. A device as claimed in claim 1 wherein said coupling flanges and said springs are made of an alloy known under the name of "Phynox".

22. A device as claimed in claim 10 wherein said second portions of said springs project rearwardly with respect to said first portions over a distance of about 1.5 mm.

23. A device as claimed in claim 10 wherein said coupling flanges and said springs are made of an alloy known under the name of "Phynox".

* * * * *